United States Patent
Yang

(10) Patent No.: US 10,789,997 B2
(45) Date of Patent: Sep. 29, 2020

(54) INPUT/OUTPUT MULTIPLEXER

(71) Applicant: Winbond Electronics Corp., Taichung (TW)

(72) Inventor: Shu-Meng Yang, Hualien County (TW)

(73) Assignee: WINBOND ELECTRONICS CORP., Taichung (TW)

(*) Notice: Subject to any disclaimer, the term of this patent is extended or adjusted under 35 U.S.C. 154(b) by 0 days.

(21) Appl. No.: 16/378,677

(22) Filed: Apr. 9, 2019

(65) Prior Publication Data

US 2019/0318769 A1 Oct. 17, 2019

(30) Foreign Application Priority Data

Apr. 12, 2018 (CN) .......................... 2018 1 0325654

(51) Int. Cl.
| | |
|---|---|
| G11C 7/10 | (2006.01) |
| H03K 19/0175 | (2006.01) |
| G11C 7/12 | (2006.01) |
| G11C 7/06 | (2006.01) |
| G11C 7/22 | (2006.01) |
| G11C 8/10 | (2006.01) |

(52) U.S. Cl.
CPC ............ G11C 7/1006 (2013.01); G11C 7/065 (2013.01); G11C 7/1057 (2013.01); G11C 7/1096 (2013.01); G11C 7/12 (2013.01); G11C 7/22 (2013.01); H03K 19/017509 (2013.01); G11C 8/10 (2013.01)

(58) Field of Classification Search
CPC ..... G11C 7/1006; G11C 7/065; G11C 7/1057; G11C 7/1096; G11C 7/12; G11C 7/22
See application file for complete search history.

(56) References Cited

U.S. PATENT DOCUMENTS

| | | | | |
|---|---|---|---|---|
| 5,191,553 A | * | 3/1993 | Mizoguchi | G11C 8/16 365/189.06 |
| 6,628,563 B1 | * | 9/2003 | Hsu | G11C 16/08 365/185.11 |
| 7,133,311 B2 | | 11/2006 | Liu | |
| 7,535,777 B2 | * | 5/2009 | Kim | G11C 7/06 327/52 |
| 8,144,526 B2 | | 3/2012 | Shiah | |
| 9,455,002 B2 | * | 9/2016 | Kim | G11C 7/08 |

FOREIGN PATENT DOCUMENTS

TW 201812766 A 4/2018

* cited by examiner

*Primary Examiner* — Pho M Luu
(74) *Attorney, Agent, or Firm* — Muncy, Geissler, Olds & Lowe, P.C.

(57) ABSTRACT

An input/output multiplexer is provided and coupled to a memory array through bit lines. The input/output multiplexer includes a bit-line amplifier, a level-raising circuit, and a sensing amplifier. The bit-line amplifier amplifies a voltage difference between voltage levels of first and second bit lines in a read mode. In a first selection period of the read mode, according to the amplified voltage difference, a voltage level of a first local-data terminal of the bit-line amplifier is initially at an initial level, and a voltage level of a second local-data terminal thereof decreases from the initial level toward that of a low supply voltage. The level-raising circuit raises the voltage level of the first local-data terminal from the initial level in the first selection period. The sensing amplifier generates readout data according to the raised voltage level of the first local-data terminal and the voltage level of the second local-data terminal.

10 Claims, 6 Drawing Sheets

INPUT/OUTPUT MULTIPLEXER

CROSS REFERENCE TO RELATED APPLICATIONS

This Application claims priority of China Application No. 201810325654.X, filed on Apr. 12, 2018, the entirety of which is incorporated by reference herein.

BACKGROUND OF THE INVENTION

Field of the Invention

The invention relates to a memory device, and more particularly to an input/output multiplexer of a memory device.

Description of the Related Art

Recently, due to increases in memory density and capacity and the requirement for memories to have high speed and low power consumption, the read-write margin at the input terminal of the sensor of an input/output multiplexer has been reduced, resulting in bottlenecks in memory capacity and speed.

BRIEF SUMMARY OF THE INVENTION

An exemplary embodiment of an input/output multiplexer is provided. The input/output multiplexer is coupled to a memory array through a plurality of bit lines. The memory array comprises a plurality of memory cells. The input/output multiplexer comprises a bit-line amplifier, a level-raising circuit, and a sensing amplifier. The bit-line amplifier is coupled to a first bit line and a second bit line among the plurality of bit lines. The bit-line amplifier operates under a high supply voltage and a low supply voltage to amplify a voltage difference between a voltage level of the first bit line and a voltage level of the second bit line in a read mode. In a first selection period of the read mode, according to the amplified voltage difference, a voltage level of a first local-data terminal of the bit-line amplifier is initially at an initial level, and a voltage level of a second local-data terminal of the bit-line amplifier decreases from the initial level toward a level of the low supply voltage. The level-raising circuit is coupled to the first local-data terminal and the second local-data terminal. The level-raising circuit raises the voltage level of the first local-data terminal from the initial level in the first selection period. The sensing amplifier is coupled to the first local-data terminal and the second local-data terminal. The sensing amplifier generates first readout data corresponding to the first bit line and second readout data corresponding to the second bit line according to the raised voltage level of the first local-data terminal and the voltage level of the second local-data terminal.

An exemplary embodiment of a memory device is provided. The memory device comprises a plurality of word lines, a plurality of bit lines interlaced with the plurality of word lines, a memory array, a decoder, and an input/output multiplexer. The memory array comprises a plurality of memory cells. Each memory cells is coupled to one of the plurality of word lines and one of the plurality of but lines. A first memory cell among the plurality of memory cells is coupled to a first word line among the plurality of word lines and a first bit line among the plurality of bit lines. A second memory cell among the plurality of memory cells is coupled to a second word line among the plurality of word lines and a second bit line among the plurality of bit lines. The decoder is coupled to the plurality of bit lines and enables the plurality of bit lines respectively. The input/output multiplexer is coupled to the plurality of bit lines and comprises a plurality of write-readout circuits. A first write/readout circuit among the plurality of the write/readout circuits comprises a bit-line amplifier, a level-raising circuit, and a sensing amplifier. The bit-line amplifier is coupled to a first bit line and a second bit line. The bit-line amplifier operates under a high supply voltage and a low supply voltage to amplify voltage a difference between a voltage level of the first bit line and a voltage level of the second bit line when the first word line is enabled in a read mode. In a first selection period of the read mode, according to the amplified voltage difference, a voltage level of a first local-data terminal of the bit-line amplifier is initially at an initial level, and a voltage level of a second local-data terminal of the bit-line amplifier decreases from the initial level toward a level of the low supply voltage. The level-raising circuit is coupled to the first local-data terminal and the second local-data terminal. The level-raising circuit raises the voltage level of the first local-data terminal from the initial level in the first selection period. The sensing amplifier is coupled to the first local-data terminal and the second local-data terminal. The sensing amplifier generates first readout data corresponding to the first bit line and second readout data corresponding to the second bit line according to the raised voltage level of the first local-data terminal and the voltage level of the second local-data terminal. The first readout data and the second readout data correspond to the voltage stored in the first memory cell.

BRIEF DESCRIPTION OF THE DRAWINGS

The invention can be more fully understood by referring to the following detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
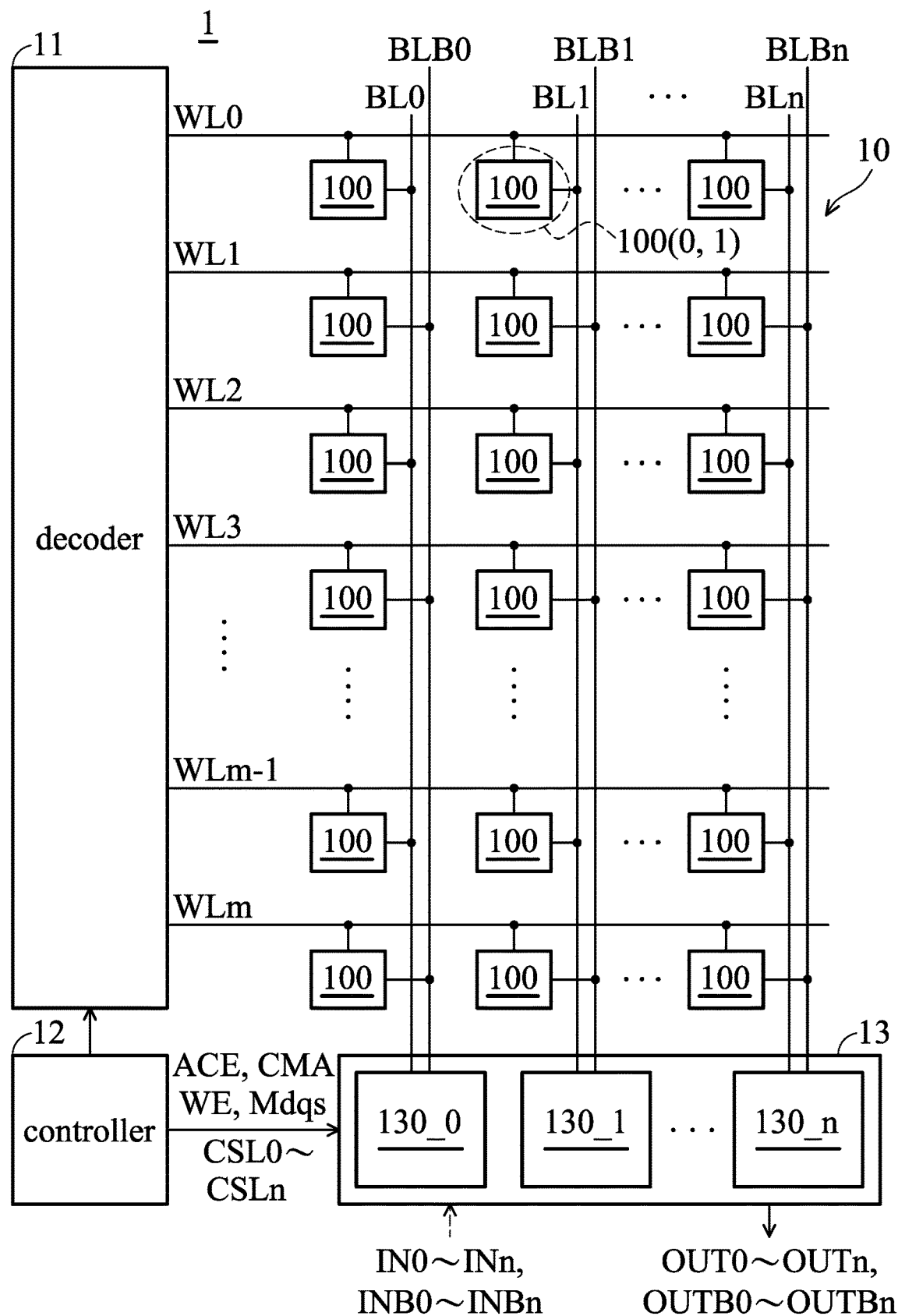
FIG. 1 shows an exemplary embodiment of a memory device.

FIG. 1 shows an exemplary embodiment of a memory device. Referring to FIG. 1, a memory device 1 comprises a memory array 10, a decoder 11, a controller 12, an input/output multiplexer 13, a plurality of word lines WL0~WLm, and a plurality of bit lines BL0~BLn and BLB0~BLBn, wherein, m is an odd greater than or equal to 1, and n is an integer greater than or equal to 1. The memory device 1 may operate in a read mode or a write mode. The memory array 10 comprises a plurality of memory cells 100 arranged in a plurality of rows (in the horizontal direction) and a plurality of columns (in the vertical direction), and each memory cell is coupled to one word line and one bit line. In the embodiment of FIG. 1, the memory cells arranged in the same row are coupled to the same word line. For example, the memory cells arranged in the first row in FIG. 1 are all coupled to the word line WL0; the memory cells arranged in the second row in FIG. 1 are all coupled to the word line WL1. Among the memory cells arranged in the same column, some are coupled to one bit line, while the other some are coupled to another bit line. For example, among the memory cells arranged in the first column in FIG. 1, the memory cells coupled to the word lines WL0, WL2, and WLm-1 are coupled to the bit line BL0, while the memory cells coupled to the word lines WL1, WL3, and WLm are coupled to the bit line BLB0; among the memory cells arranged in the second column in FIG. 1, the memory cell coupled to the word line WL0, WL2, and WLm-1 is coupled to bit line BL1, while the memory cells coupled to the word line WL1, WL3, and WLm are coupled to the bit line BLB1. Therefore, the memory cells arranged in the same column are coupled to the bit lines BLx and BLBx alternately, wherein x is equal to an integer from 0 to n. In the embodiment, the bit lines BLx and BLBx coupled to the memory cells arranged in the same column are referred to as a bit-line set.

The decoder 11 is coupled to the word lines WL0~WLm. The decoder 11 enables one word line at a time, thereby selecting the memory cells arranged on the corresponding row. Then, the memory device 1 can perform data reading or data writing on the selected memory cells. The timing at which the decoder 11 enables the word lines WL0~WLm is controlled by the controller 12.

The input/output multiplexer 13 comprises a plurality of write/readout circuits 130_0~130_n. Each write/readout circuit corresponds to the memory cells on one column, that is, each write/read circuit is coupled to a corresponding bit-line set. For example, the write/readout circuit 130_0 is coupled to the bit-line set including the bit lines BL0 and BLB0; the write/readout circuit 130_1 is coupled to the bit-line set including the bit lines BL1 and BLB1. The input/output multiplexer 13 receives an acceleration enable voltage (a variable voltage) ACE, a write enable signal WE, a switch signal Mdqs, a sensing enable signal CMA, and selection signals CSL0-CSLn from the controller 12 to control the operation of the write/readout circuits 130_0~130_n. The selection signals CSL0~CSLn are provided to the write/readout circuits 130_0~130_n respectively. Through the operation of the input/output multiplexer 13, the memory device 1 can generate readout data OUT0~OUTn and OUTB0~OUTBn corresponding to the voltages stored in the memory cells 100 in the read mode and further change the voltages stored in the memory cells 100 according to write-in data IN0~INn in the write mode.

Figure 2:
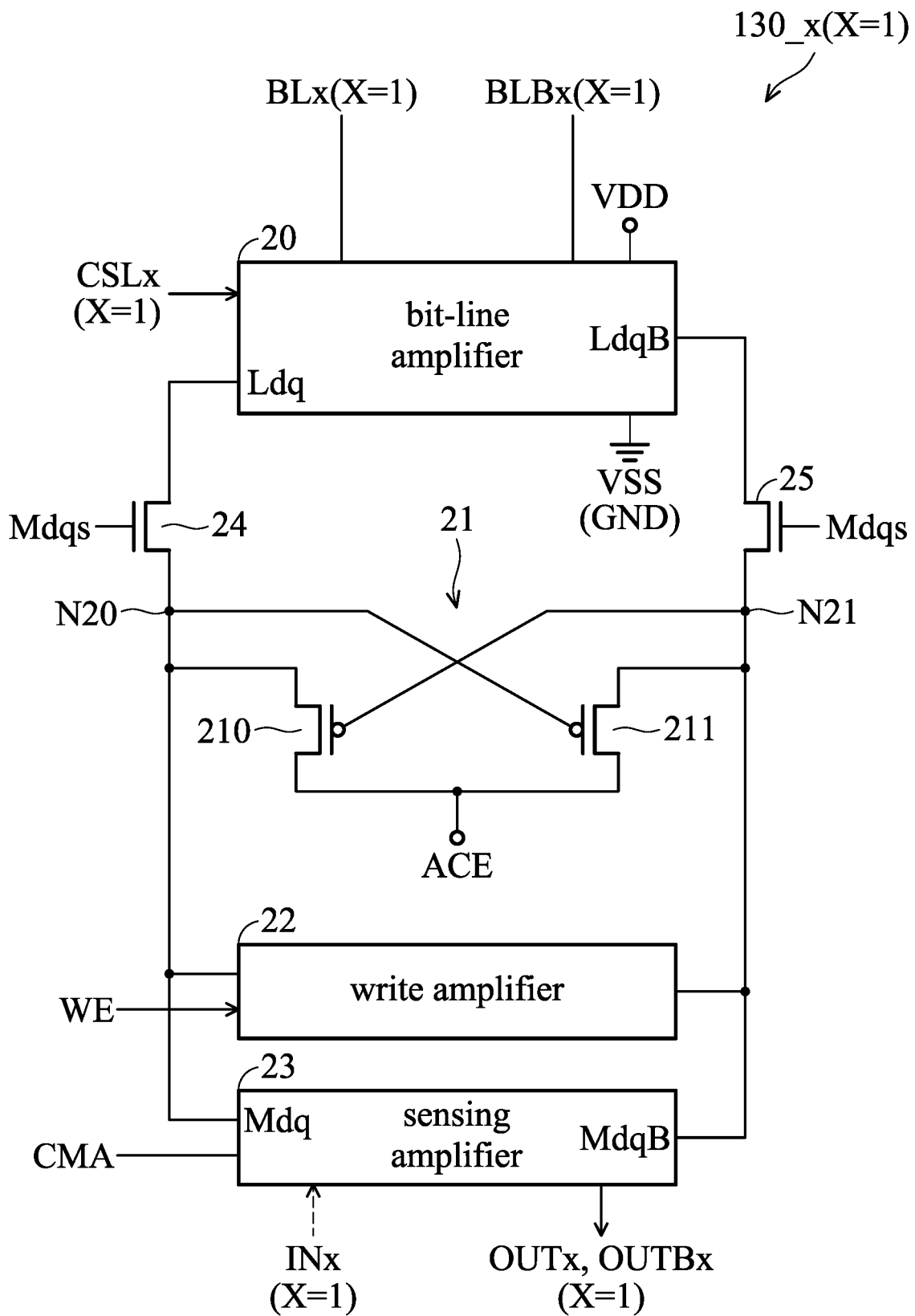
FIG. 2 shows a structure of a write/readout circuit according to an exemplary embodiment.

FIG. 2 shows the structure of the write/readout circuit 130_x according to an exemplary embodiment. Referring to FIG. 2, the write/output circuit 130_x is any one of the write/readout circuits 130_0 to 130_n. Hereinafter, the operation of the input/output multiplexer 13 in the read mode and in the write mode will be described by taking the write/readout circuit 130_x as the write/readout circuit 130_1 (x=1) as an example. The write/readout circuit 130_1 comprises a bit-line amplifier 20, a level-raising circuit 21, a write amplifier 22, a sensing amplifier 23, and N-type transistors 24 and 25. The bit-line amplifier 20 is coupled to "one corresponding bit-line set including the bit lines BL1 and BLB1 and is controlled by the selection signal CSL1.

Figure 3:
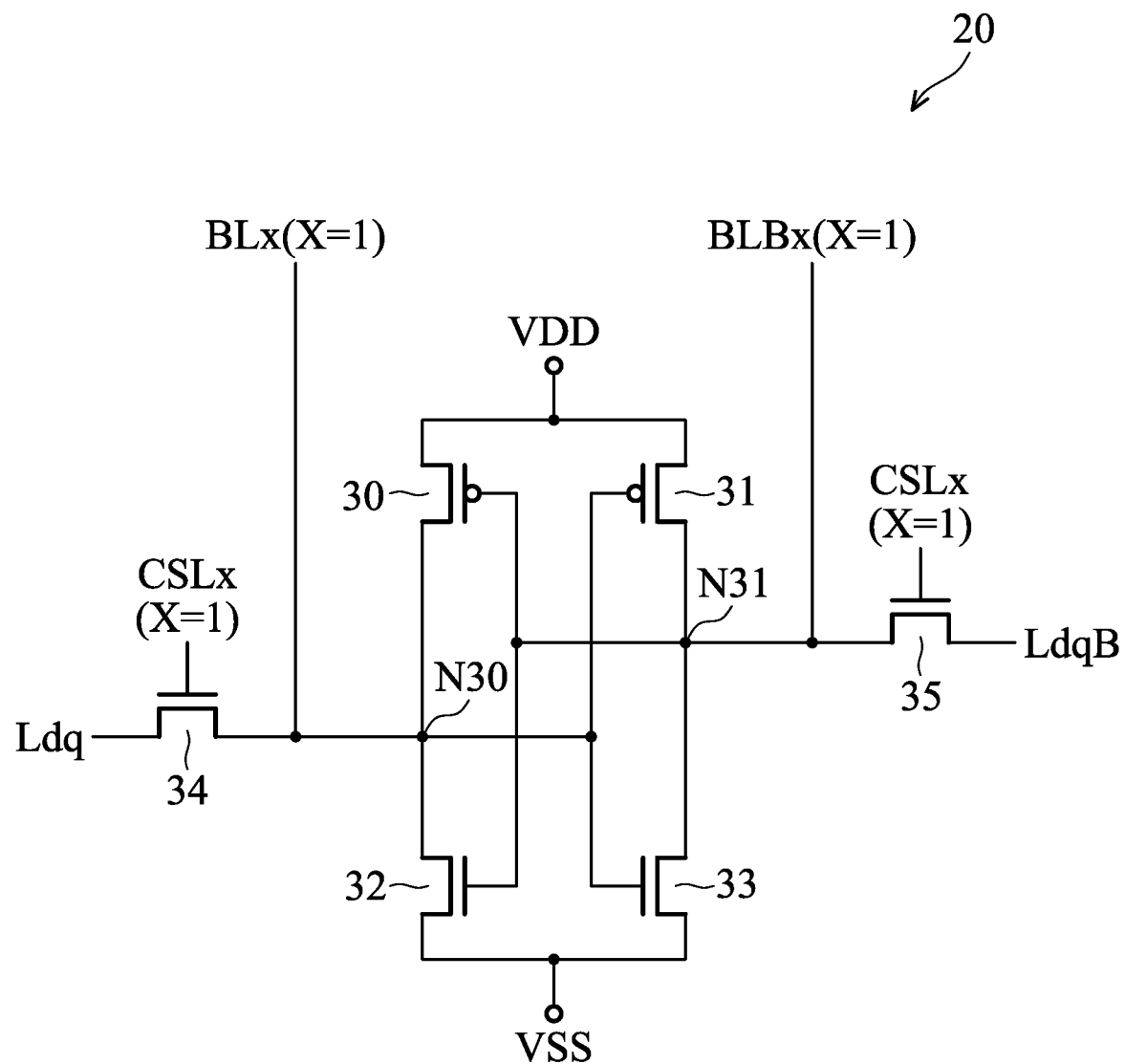
FIG. 3 shows an exemplary embodiment of a bit-line amplifier.

FIG. 3 shows an exemplary embodiment of the bit-line amplifier 20. Referring to FIG. 3, the bit-line amplifier 20 operates at a high supply voltage VDD and a low supply voltage VSS. The bit-line amplifier 20 is connected to the bit lines BL1 and BLB1 through nodes N30 and N31, respectively. The bit-line amplifier 20 comprises P-type transistors 30 and 31 and N-type transistors 32~35. The first terminal (source) of the P-type transistor 30 receives the high supply voltage VDD, the second terminal (drain) thereof is coupled to a node N30, and the control terminal (gate) thereof is coupled to a node N31. The first terminal of the P-type transistor 31 receives the high supply voltage VDD, the second terminal thereof is coupled to the node N31, and the control terminal thereof is coupled to the node N30. The first terminal (drain) of the N-type transistor 32 is coupled to the node N30, the second terminal (source) thereof receives the low supply voltage VSS, and the control terminal (gate) thereof is coupled to the node N31. The first terminal of the N-type transistor 33 is coupled to the node N31, the second terminal thereof receives the low supply voltage VSS, and the control terminal thereof is coupled to the node N30. The first terminal of the N-type transistor 34 is coupled to the node N30, the second terminal thereof is coupled to a local-data terminal Ldq of the bit-line amplifier 20, and the control terminal thereof receives the selection signal CSL1. The first terminal of the N-type transistor 35 is coupled to the node N31, the second terminal thereof is coupled to a local-data terminal LdqB of the bit-line amplifier 20, and the control terminal thereof receives the selection signal CSL1. In the embodiment, the low supply voltage VSS is lower than the high supply voltage VDD, for example, the low supply voltage VDD is the ground voltage GND. Through the operations of the transistors 30-33, the bit-line amplifier 20 can amplify the voltage difference between the voltage levels of the bit lines BL1 and BLB1 to a voltage difference between the high supply voltage VDD and the low supply voltage VSS. The voltage levels of the local-data terminals Ldq and LdqB is initially an initial level Vint, for example, the initial level Vint is equal to the level of the high supply voltage VDD.

Referring to FIG. 2, the first terminal (drain) of the N-type transistor 24 is coupled to the local-data terminal Ldq, and the second terminal (source) thereof is coupled to a node N20, and the control terminal (gate) thereof receive the switch signal Mdqs. The first terminal of the N-type transistor 25 is coupled to the local-data terminal LdqB, the second terminal thereof is coupled to a node N21, and the control terminal thereof receives the switching signal Mdqs. In both the read mode and the write mode, the controller 12 enables the switch signal Mdqs to turn on the N-type transistors 24 and 25.

The level-raising circuit 21 comprises P-type transistors 210 and 211. Each of the P-type transistors 210 and 211 have a threshold voltage Vthp. The first terminal (source) of the P-type transistor 210 is coupled to the node N20, the second terminal (drain) thereof receives a variable voltage ACE, and the control terminal (gate) thereof is coupled to the node N21. The first terminal of the P-type transistor 211 is coupled to the node N21, the second terminal thereof receives the variable voltage ACE, and the control terminal thereof is coupled to the node N20. In the embodiment, the level of the variable voltage ACE is not fixed, and it can be changed between a preset level (for example, the level $V_A$ shown in FIG. 4) and the level of the low supply voltage VSS. In an embodiment, the preset level is higher than the level of the high supply voltage VDD and does not exceed the voltage level of the sum of the high supply voltage VDD and the threshold voltage Vthp. In other words, the maximum value of the variable voltage is greater than the high supply voltage VDD but does not exceed the sum of the high supply voltage VDD and the threshold voltage Vthp.

The write amplifier 22 is coupled to the nodes N20 and N21. That is, the write amplifier 22 is coupled to the local-data terminal Ldq through the node N20 and the N-type transistor 24 and further coupled to the local-data terminal LdqB through the node N21 and the N-type transistor 25. The write amplifier 22 receives the write enable signal WE from the controller 12 and operates in the write mode under the control of the write enable signal WE. Main-data terminals Mdq and MdqB of the sensing amplifier 23 are coupled to the nodes N20 and N21 respectively. That is, the main data terminal Mdq of the sensing amplifier 23 is coupled to the local-data terminal Ldq through the node N20 and the N-type transistor 24, and the main-data terminal MdqB of the sensing amplifier 23 is coupled to the local-data terminal LdqB through the node N21 and the N-type transistor 25. The voltage levels of the main-data terminals Mdq and MdqB are initially the initial level Vint. The sensing amplifier 23 receives the sensing enable signal CMA from the controller 12 and operates in the read mode under the control of the sense enable signal CMA.

In the following paragraphs, the detailed operation of the input/output multiplexer 13 will be described by taking the write/readout circuit 130_1 as an example.

Figure 4:
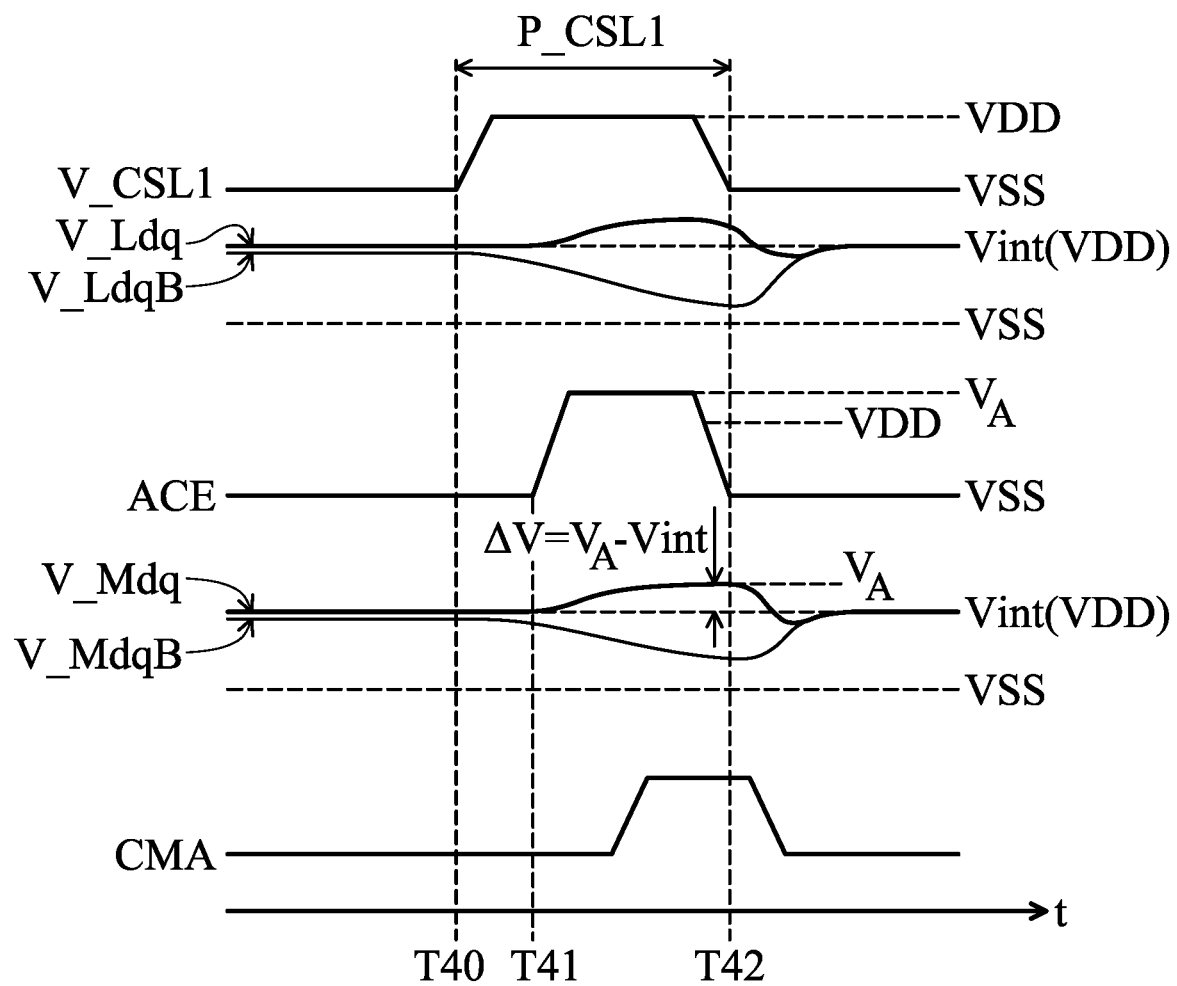
FIG. 4 is a timing chart showing of variation of main signals and main voltage levels of the memory device in FIG. 1 in a read mode.

FIG. 4 is a timing chart showing the variation of the voltage level V_CSL of the selection signal CSL1, the voltage levels V_Ldq and V_LdqB of the local-data terminals Ldq and LdqB, the variable voltage ACE, and the voltage levels V_Mdq and V_MdqB of the main-data terminals Mdq and MdqB, and the sensing enable signal CMA in the read mode. Assume that the memory device 1 intends to perform a data read operation on the memory cells coupled to the word line WL1 and the bit line BL1 (circled by the dashed line and labeled as 100(0,1)) in the read mode. The operation of the write/readout circuit 130_1 in the read mode will be described below with reference to FIGS. 2-4. The N-type transistors 24 and 25 are turned on in the read mode. In cases where the data read operation is to be performed on the memory cell 100(0,1), the controller 12 controls the decoder 11 to enable only the word line WL1, thereby selecting the memory cell 100(0,1). The voltage stored in the memory cell 100(0,1) indicates that the data stored in the memory cell 100(0,1) is "1" or "0" in the digital domain. For example, when the memory cell 100 (0, 1) stores a high voltage, the stored data is "1" in the digital domain; when the memory cell 100 (0, 1) stores a low voltage, the stored data is "0" in the digital domain. When the word line WL1 is enabled, the voltage level of the bit line BL1 coupled to the memory cell 100(0,1) changes with the voltage stored in the memory cell 100(0,1). For example, the voltage level of the bit line BL1 starts to rise from a pre-charge level (for example, ½ VDD) according to the voltage stored in the memory cell 100(0,1). Since the decoder 11 does not enable the other word lines WL0 and WL2-WLm, the memory cells coupled to the word line BLB1 are not selected, so that the voltage level of the word line BLB1 remains at the pre-charge level. At this time, through the operations of the transistors 30 to 33 of the bit-line amplifier 20, the voltage level of the node N30 is clamped at the voltage of the high supply voltage VDD and the voltage level of the node N31 is clamped at level of the low supply voltage VSS. In other words, the difference between the voltage levels of the bit lines BL1 and BLB1 is amplified to the difference between the high supply voltage VDD and the low supply voltage VSS.

In the read mode, the selection signal CSL1 is enabled (that is, the voltage level of the selection signal CSL1 becomes to the level of the high supply voltage VDD) at the time point T40. The period during which the selection signal CSL1 is at the high voltage level is referred to as a selection period P_CSL1. When the selection signal CSL1 is at the level of the high supply voltage VDD, the N-type transistors 34 and 35 are turned on. At this time, the voltage level V_Ldq of the local-data terminal Ldq remains at its initial level Vint (that is, the level of the high supply voltage VDD) along with the voltage level of the node N30, and the voltage level V_LdqB of the local-data terminal LdqB starts to gradually decrease from the initial level Vint toward the level of the low supply voltage VSS along with the voltage level of the node N31. The variable voltage ACE is always at the level of the low supply voltage VSS until the time point T41. Therefore, in the period between the time points T40 and T41, the P-type transistors 210 and 211 are turned off, the voltage level V_Ldq continuously remains at its initial level Vint, and the voltage level V_LdqB continuously decreases toward the level of the low supply voltage VSS. When the variable voltage ACE rises to the preset level $V_A$ (that is, the level of the high supply voltage VDD) at the time point T41, the P-type transistor 210 is turned on, and the P-type transistor 211 is continuously turned off. At this time, the voltage level V_Ldq is raised gradually from the initial level Vint toward the preset level $V_A$ according to the rising variable voltage ACE, and the voltage level V_LdqB continuously decreases toward the level of the low supply voltage VSS. Referring to FIG. 4, since the main-data terminals Mdq and MdqB are coupled to the local-data terminals Ldq and LdqB respectively, the voltage levels V_Mdq and V_MdqB change with the voltage levels V_Ldq and V_LdqB, wherein after the time point T41, the voltage level V_Mdq is raised gradually from the initial level Vint toward the preset level $V_A$. According to an embodiment of the present invention, the time point T41 at which the level of the variable voltage ACE starts to rise is delayed from the start time point T40 of the selection period P_CSL1, and the level of the variable voltage ACE switches to the level of the low supply voltage VSS at the end of the selection period P_CSL1 (the time point T42).

When the controller 12 enables the sensing enable signal CMA during the selection period P_CSL1, the sensing amplifier 23 senses the voltage levels V_Mdq and V_MdqB of the main-data terminals Mdq and MdqB to generate readout data OUT1 and OUTB1 corresponding to the voltage stored in the memory cell 100(0,1). The back-end device coupled to the memory device 1, such as a processor, can learn that the data stored in the memory cell 100(0,1) is logical "1" or "0" according to the readout data OUT1 and OUTB1. Referring to FIG. 4, since the voltage level V_Mdq does not always remain at the initial level Vint after the time point T41 but gradually raised from the initial level Vint toward the preset level $V_A$, the difference between the voltage levels V_Mdq and V_MdqB increases, so that the sensing margin of the sense amplifier 23 at the main-data terminal Mdq relative to the main-data terminal increases, which increases the reading speed of the memory device 1. As shown in FIG. 4, compared with the cases where the voltage level V_Mdq in the prior art is still at the initial level Vin, since the level-raising circuit 21 of the embodiment of the present invention raises the voltage level V_Mdq, the sensing margin increases by a magnitude of ΔV, wherein ΔV=VA−Vint.

Figure 5:
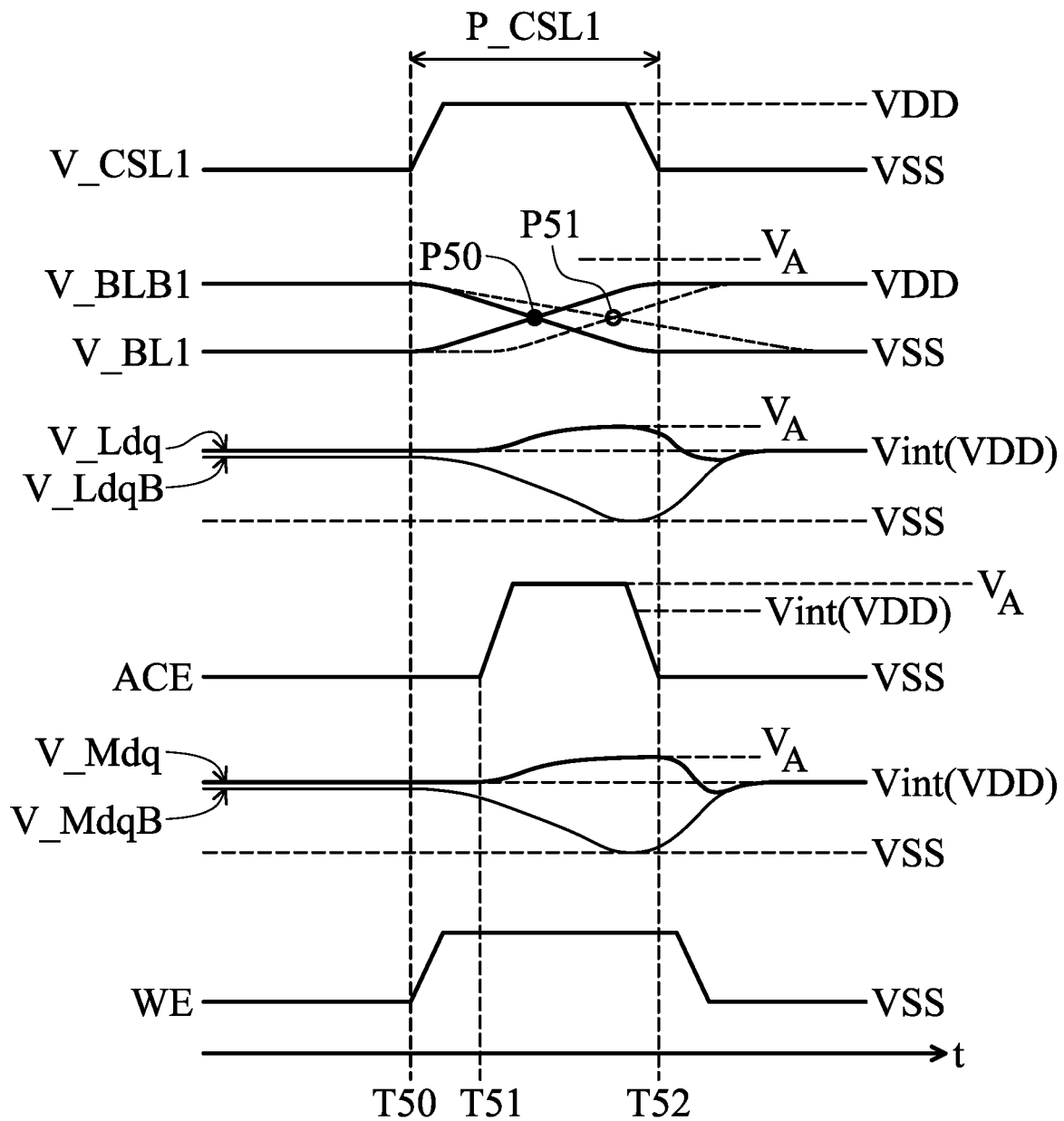
FIG. 5 is a timing chart showing of variation of main signals and main voltage levels of the memory device in FIG. 1 in a write mode.

FIG. 5 shows a timing chart of the variation of the voltage level V_CSL of the selection signal CSL1, the voltage levels V_Ldq and V_LdqB of the local-data terminals Ldq and LdqB, the variable voltage ACE, and the voltage levels V_Mdq and V_MdqB of the main-data terminals Mdq and MdqB, and the sensing enable signal CMA in the write mode. V_MdqB. Assume that the memory device 1 intends to perform a data write operation on the memory cell 100(0, 1) in the write mode to write the data "1" to the memory cell 100(0,1) which originally stores the data "0". The operation of the write/readout circuit 130_1 in the write mode will be described below with reference to FIGS. 2, 3, and 5. The N-type transistors 24 and 25 are turned on in the write mode. In cases where the data write operation is performed on the memory cell 100(0,1), the controller 12 controls the decoder 11 to enable only the word line WL1, thereby selecting the memory cell 100(0,1). In the write mode, the write amplifier 22 receives the write-in data IN1. When the controller 12 enables the write enable signal WE, the write amplifier 22 operates according to the write-in data IN1, so that the voltage level V_Mdq of the main-data terminal Mdq remains at its initial level Vint (that is, the level of the high supply voltage VDD), and the voltage level V_MdqB of the main-data terminal MdqB starts to gradually decreases from the initial level Vint toward the level of the low supply voltage VSS. Since the local-data terminals Ldq and LdqB are coupled to the main-data terminals Mdq and MdqB respectively, the variation of the voltage levels V_Ldq and V_LdqB is the same as the variation of the voltage levels V_Mdq and V_MdqB. As shown in FIG. 5, the voltage level V_Ldq remains at its initial level Vint, and the voltage level V_LdqB gradually decreases from the initial level Vint toward the level of the low supply voltage VSS.

In the write mode, the selection signal CSL1 is enabled (that is, the voltage level of the selection signal CSL1 becomes to the level of the high supply voltage VDD) at the time point T50. When the selection signal CSL1 is at the level of the high supply voltage VDD, the N-type transistors 34 and 35 are turned on. At this time, through operations of the transistors 30-33 of the bit-line amplifier 20, the voltage level V_BL1 of the bit line BL1 starts to gradually rise from the level of the low supply voltage VSS toward the level of the high supply voltage VDD in response to the voltage level V_Ldq of the local data terminal Ldq, and the voltage level V_BLB1 of the bit line BLB1 stars to gradually decrease from the level of the high supply voltage VDD toward the level of the low supply voltage VSS in response to the voltage level V_LdqB of the local data terminal LdqB. The variable voltage ACE is always at the level of the low supply voltage VSS until the time point T51. Therefore, in the period between the time points T50 and T51, the P-type transistors 210 and 211 are turned off, the voltage level V_Ldq continuously remains at its initial level Vint, and the voltage level V_LdqB continuously decreases toward the level of the low supply voltage VSS. When the variable voltage ACE rises to the preset level $V_A$ (that is, the level of the high supply voltage VDD) at the time point T51, the P-type transistor 210 is turned on, and the P-type transistor 211 is turned off continuously. At this time, the voltage level V_Ldq gradually raised from the initial level Vint toward the preset level $V_A$ according to the rising variable voltage ACE, and the voltage level V_LdqB continuously decreases toward the low supply voltage VSS. Referring to FIG. 5, the variation of the voltage levels V_Mdq and V_MdqB is the same as the variation of the voltage levels V_Ldq and V_LdqB. According to an embodiment of the present invention, the time point T51 at which the level of the variable voltage ACE starts to rise is delayed from the start time T50 of the selection period P_CSL1, and the level of the variable voltage ACE is switched to the level of the low supply voltage VSS at the end of the selection period P_CSL1 (the time point T52).

Since the difference between the voltage levels V_Ldq and V_LdqB increases, the voltage level V_BL1 of the bit line BL1 can quickly rise to the level of the high supply voltage VDD, and the voltage level V_BLB1 of the bit line BLB1 can quickly decreases to the level of low supply voltage VSS. Referring to FIG. 5, due to the rapid change of the voltage levels V_BL1 and V VBLB1 in the selection period P_CSL1, the metastable point P50 of the bit-line amplifier 20 occurs earlier than the metastable point P51 of the prior art. This allows the selected memory cell 100(0,1) to quickly store the voltage representing the corresponding data "1" according to the voltage level V_BL1 of the bit line BL1.

According to the above description, the memory device 1 of the present invention increases the voltage difference between the local data terminals Ldq and LdqB (and the voltage difference between the main data terminals Mdq and MdqB) through the level-raising circuit 21, thereby improving the read and write speeds for the memory cells without sacrificing the read/write margin of the input/output multiplexer 13.

Figure 6:
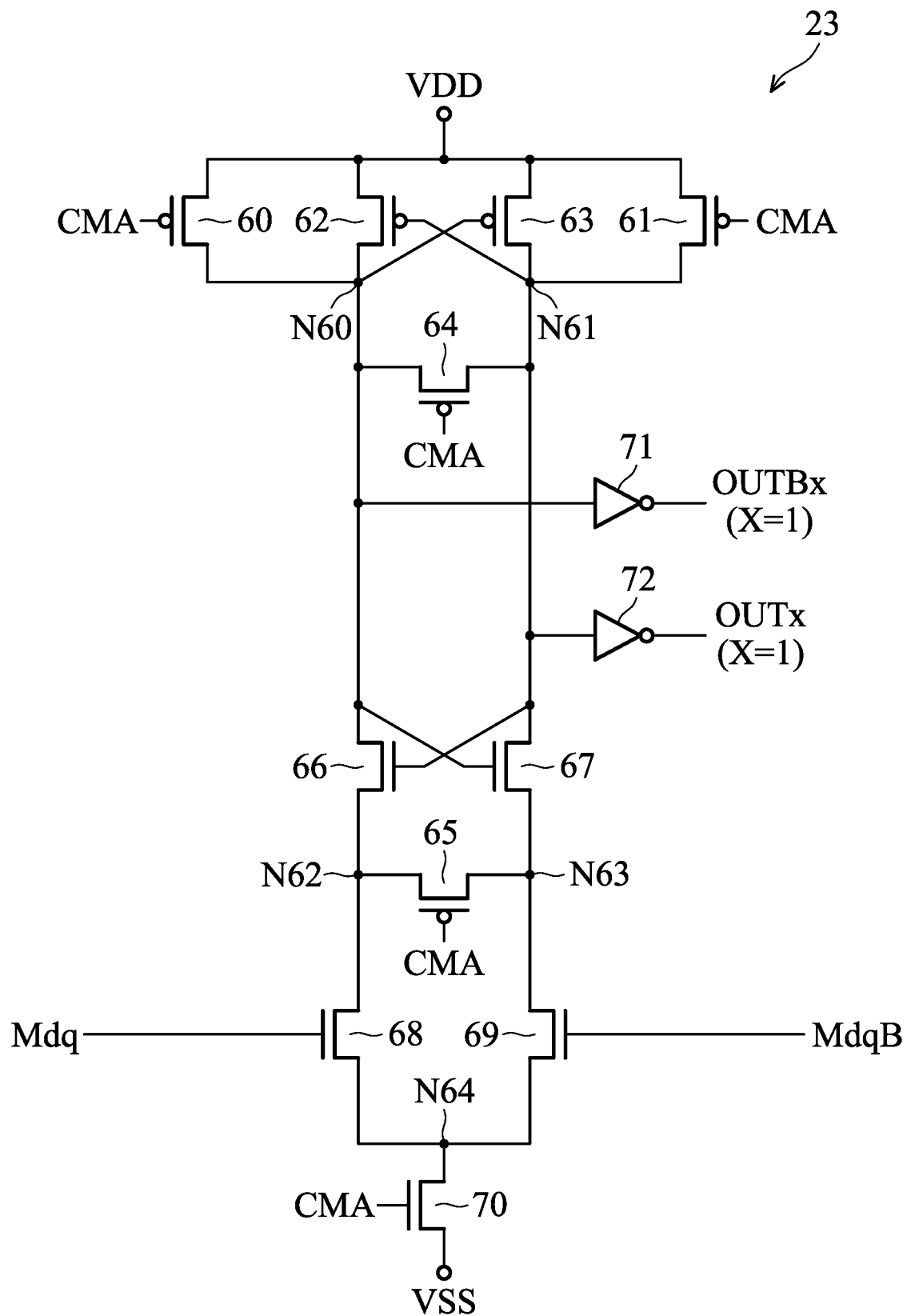
FIG. 6 shows an exemplary embodiment of a sensing amplifier.

FIG. 6 shows an exemplary embodiment of the sensing amplifier 23. Referring to FIG. 6, the sensing amplifier 23 comprises P-type transistors 60-65, N-type transistors 66-70, and inverters 71 and 72. The first terminal (source) of the P-type transistor 60 receives a high supply voltage VDD, the second end (drain) thereof is coupled to a node N60, and the control terminal (gate) thereof receives the sensing enable signal CMA. The first terminal of the P-type transistor 61 receives the high supply voltage VDD, the second terminal thereof is coupled to a node N61, and the control terminal thereof receives the sensing enable signal CMA. The first terminal of the P-type transistor 62 receives the high supply voltage VDD, the second terminal thereof is coupled to the node N60, and the control terminal thereof is coupled to the node N61. The first terminal of the P-type transistor 63 receives the high supply voltage VDD, the second terminal thereof is coupled to the node N61, and the control terminal thereof is coupled to the node N60. The first terminal of the P-type transistor 64 is coupled to the node N60, the second terminal thereof is coupled to the node N61, and the control terminal thereof receives the sensing enable signal CMA.

The first terminal (drain) of the N-type transistor 66 is coupled to the node N60, the second terminal (source) thereof is coupled to the node N62, and the control terminal (gate) thereof is coupled to the node N61. The first terminal of the N-type transistor 67 is coupled to the node N61, the second terminal thereof is coupled to a node N63, and the control terminal thereof is coupled to the node N60. The first terminal of the P-type transistor 65 is coupled to a node N62, the second terminal thereof is coupled to the node N63, and the control terminal thereof receives the sensing enable signal CMA. The first terminal of the N-type transistor 68 is coupled to the node N62, the second terminal thereof is coupled to a node N64, and the control terminal thereof is coupled to the main-data terminal Mdq. The first terminal of the N-type transistor 69 is coupled to the node N63, the second terminal thereof is coupled to the node N64, and the control terminal thereof is coupled to the main-data terminal MdqB. The first terminal of the N-type transistor 70 is coupled to the node N64, the second terminal thereof receives the low supply voltage VSS, and the control terminal thereof receives the sensing enable signal CMA.

The input terminal of the inverter 71 is coupled to the node N60, and the readout data OUTBx (for example, x=1) is generated at the output terminal of the inverter 71. The input terminal of the inverter 72 is coupled to the node N61, and the readout data OUTx (for example, x=1) is generated at the output terminal of the inverter 72. Through the operations of the P-type transistors 60-65, the N-type transistors 66-70, and the inverters 71 and 72, the sensing amplifier 23 can generate readout data OUT1 and OUTB1 according to the voltage levels V_Mdq and V_MdqB of the main-data terminals Mdq and MdqB to indicate the voltage stored in the corresponding memory cell.

The circuit structure shown in FIG. 6 is only an example. In other embodiments, the sensing amplifier 23 of the present invention may be implemented with different circuit architectures.

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). For example, it should be understood that the system, device and method may be realized in software, hardware, firmware, or any combination thereof. Therefore, the scope of the appended claims should be accorded the broadest interpretation so as to encompass all such modifications and similar arrangements.

What is claimed is:

1. An input/output multiplexer coupled to a memory array through a plurality of bit lines, the memory array comprising a plurality of memory cells, and the input/output multiplexer comprising:
   a bit-line amplifier, coupled to a first bit line and a second bit line among the plurality of bit lines, operating under a high supply voltage and a low supply voltage to amplify a voltage difference between a voltage level of the first bit line and a voltage level of the second bit line in a read mode, wherein in a first selection period of the read mode, according to the amplified voltage difference, a voltage level of a first local-data terminal of the bit-line amplifier is initially at an initial level, and a voltage level of a second local-data terminal of the bit-line amplifier decreases from the initial level toward a level of the low supply voltage;
   a level-raising circuit, coupled to the first local-data terminal and the second local-data terminal, raising the voltage level of the first local-data terminal from the initial level in the first selection period; and
   a sensing amplifier, coupled to the first local-data terminal and the second local-data terminal, generating first readout data corresponding to the first bit line and second readout data corresponding to the second bit line according to the raised voltage level of the first local-data terminal and the voltage level of the second local-data terminal.

2. The input/output multiplexer as claimed in claim 1, wherein the level-raising circuit comprises:
   a first transistor having a control terminal coupled to the second local-data terminal, a first terminal coupled to the first local-data terminal, and a second terminal receiving a variable voltage; and
   a second transistor having a control terminal coupled to the first local-data terminal, a first terminal coupled to the second local-data terminal, and a second terminal receiving the variable voltage.

3. The input/output multiplexer as claimed in claim 2, wherein a level of the variable voltage is initially at the level of the low supply voltage, and in the first selection period, the level of the variable voltage rises to a level that is higher than a level of the high supply voltage.

4. The input/output multiplexer as claimed in claim 3, wherein a time point when the variable voltage starts to rise is delayed from a start time point of the first selection period.

5. The input/output multiplexer as claimed in claim 2, wherein each of the first transistor and the second transistor has a threshold voltage, and the maximum value of the variable voltage does not exceed a sum of the high supply voltage and the threshold voltage.

6. The input/output multiplexer as claimed in to claim 2, wherein each of the first transistor and the second transistor is a P-type transistor.

7. The input/output multiplexer as claimed in claim 2, further comprising:
   a third transistor coupled between the first local-data terminal and the level-raising circuit; and
   a fourth transistor coupled between the second local-data terminal and the level-raising circuit,
   wherein the third transistor and the fourth transistor are turned on in the read mode.

8. The input/output multiplexer as claimed in claim 7, wherein each of the third transistor and the fourth transistor is an N-type transistor.

9. The input/output multiplexer as claimed in claim 1, further comprising:
   a write amplifier, coupled to the first local-data terminal and the second local-data terminal, receiving write-in data in a write mode,
   wherein in the write mode, the write amplifier operates according to the write-in data, so that the voltage level of the first local-data terminal is initially at an initial level, and the voltage level of the second local-data terminal decreases from the initial level toward the level of the low supply voltage,
   wherein in a second selection period of the write mode, the level-raising circuit raises the voltage level of the first local-data terminal from the initial level; and
   wherein in the second selection period, the bit-line amplifier changes the voltage level of the first bit line and the voltage level of the second bit line according to the raised voltage level of the first local-data terminal and the voltage level of the second local-data terminal in a read mode, thereby writing a voltage corresponding to the write-in data into one of the plurality of memory cells.

10. The input/output multiplexer as claimed in claim 1, wherein the initial level is equal to a level of the high supply voltage.

* * * * *